United States Patent
Nishibayashi et al.

(10) Patent No.: US 12,258,677 B2
(45) Date of Patent: Mar. 25, 2025

(54) SYNTHETIC SINGLE CRYSTAL DIAMOND, TOOL INCLUDING THE SAME AND METHOD OF PRODUCING SYNTHETIC SINGLE CRYSTAL DIAMOND

(71) Applicant: SUMITOMO ELECTRIC INDUSTRIES, LTD., Osaka (JP)

(72) Inventors: Yoshiki Nishibayashi, Osaka (JP); Minori Teramoto, Osaka (JP); Yutaka Kobayashi, Osaka (JP); Hitoshi Sumiya, Osaka (JP); Issei Satoh, Osaka (JP); Ryo Toyoshima, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 130 days.

(21) Appl. No.: 17/778,835

(22) PCT Filed: Aug. 14, 2020

(86) PCT No.: PCT/JP2020/030835
§ 371 (c)(1),
(2) Date: May 21, 2022

(87) PCT Pub. No.: WO2021/106283
PCT Pub. Date: Jun. 3, 2021

(65) Prior Publication Data
US 2022/0411963 A1   Dec. 29, 2022

(30) Foreign Application Priority Data
Nov. 26, 2019   (JP) .................................. 2019-213282

(51) Int. Cl.
C30B 29/04   (2006.01)
C30B 9/10   (2006.01)

(52) U.S. Cl.
CPC ................ *C30B 29/04* (2013.01); *C30B 9/10* (2013.01)

(58) Field of Classification Search
CPC ............ C30B 29/04; C30B 33/04; C30B 9/10
See application file for complete search history.

(56) References Cited

U.S. PATENT DOCUMENTS

2013/0192144 A1* 8/2013 Twitchen ................ C23C 14/48
51/307
2014/0219907 A1   8/2014 Ikeda et al.
(Continued)

FOREIGN PATENT DOCUMENTS

EP   0327111 A2   8/1989
EP   0346794 A1   12/1989
(Continued)

OTHER PUBLICATIONS

Sumiya, "HPHT Synthesis of Large, High-Quality, Single Crystal Diamonds," Comprehensive Hard Materials, vol. 3, p. 195-215 (Year: 2014).*
(Continued)

*Primary Examiner* — Matthew J Song
(74) *Attorney, Agent, or Firm* — Renner, Otto, Boisselle & Sklar, LLP

(57) ABSTRACT

Provided is a synthetic single-crystal diamond containing nitrogen. In an X-ray absorption fine structure thereof, a ratio $I_{405}/I_{412}$ between an intensity $I_{405}$ of a peak which appears at an energy of 405±1 eV and has a full width at ¾ maximum of 3 eV or more and an intensity $I_{412}$ of a peak which appears at an energy of 412±2 eV is less than 1.5.

9 Claims, 2 Drawing Sheets

(56) References Cited

U.S. PATENT DOCUMENTS

2018/0141818 A1* 5/2018 Yamamoto .............. C01B 32/25
2020/0325596 A1* 10/2020 Sumiya ..................... C30B 9/10

FOREIGN PATENT DOCUMENTS

| EP | 603995 A1 | 6/1994 | | |
|---|---|---|---|---|
| JP | 5-329356 A | 12/1993 | | |
| JP | 6-182184 A | 7/1994 | | |
| JP | 2015-134718 A | 7/2015 | | |
| WO | 2011/151416 A2 | 12/2011 | | |
| WO | 2013/031907 A1 | 3/2013 | | |
| WO | 2016/203950 A1 | 12/2016 | | |
| WO | WO-2019077888 A1 * | 4/2019 | ............ | B01J 19/081 |

OTHER PUBLICATIONS

A T Collins, Vacancy enhanced aggregation of nitrogen in diamond, Journal of Physics C: Solid State Physics, the Institute of Physics, UK, 1980, No. 13, p. 2641-50 (cited in specification).

\* cited by examiner

SYNTHETIC SINGLE CRYSTAL DIAMOND, TOOL INCLUDING THE SAME AND METHOD OF PRODUCING SYNTHETIC SINGLE CRYSTAL DIAMOND

TECHNICAL FIELD

The present disclosure relates to a synthetic single crystal diamond, a tool including the same, and a method of producing a synthetic single crystal diamond. The present application claims the benefit of priority to Japanese Patent Application No. 2019-213282 filed on Nov. 26, 2019, the entire contents of which are incorporated herein by reference.

BACKGROUND ART

Since single crystal diamond has high hardness, it has been widely used in tools such as cutting tools, grinding tools, and anti-wear tools. Single crystal diamond used in tools includes natural diamond and synthetic diamond.

Most of the natural diamonds (type Ia diamond) contain aggregated nitrogen atoms as impurities. The aggregated nitrogen atoms in the diamond crystal can inhibit the plastic deformation and/or the progress of cracks when the diamond is used in a tool. Therefore, natural diamond has high mechanical strength. However, since natural diamond varies greatly in quality and the supply thereof is not stable, the application of natural diamond in the industrial field is limited.

Since synthetic diamond is constant in quality and could be supplied stably, it has been widely used in the industrial field.

Generally, synthetic diamond (type Ib diamond) contains isolated substitutional nitrogen atoms as impurities. It is known that the mechanical properties of diamond will be deteriorated as the concentration of isolated substitutional nitrogen atoms in diamond crystals increases. Therefore, when type Ib synthetic diamond is used in a tool, the cutting edge thereof is likely to be worn or chipped off.

Further, some synthetic diamonds (type IIa diamond) contain almost no nitrogen impurities. Since type IIa synthetic diamond does not contain impurities or crystal defects that can inhibit the progress of cracks, when it is used in a tool, the cutting edge of the tool is likely to be chipped off.

Therefore, studies have been carried out on techniques for improving wear resistance and chipping resistance in synthetic diamonds.

PTL 1 (Japanese Patent Laying-Open No. 2015-134718) discloses a technique for improving the toughness and wear resistance of diamond by irradiating type Ib synthetic diamond material with an electron beam or a neutron beam to form isolated vacancy defects in the diamond material and annealing the diamond material thereafter.

NPL 1 (A T Collins, Vacancy enhanced aggregation of nitrogen in diamond, Journal of Physics C: Solid State Physics, the Institute of Physics, UK, 1980, No. 13, p. 2641-50) discloses a technique in which after type Ib synthetic diamond material is irradiated with an electron beam, a heat treatment is performed to convert isolated substitutional nitrogen atoms in the crystal into aggregated nitrogen atoms.

CITATION LIST

Patent Literature

PTL 1: Japanese Patent Laying-Open No. 2015-134718

Non Patent Literature

NPL 1: A T Collins, Vacancy enhanced aggregation of nitrogen in diamond, Journal of Physics C: Solid State Physics, the Institute of Physics, UK, 1980, No. 13, p. 2641-50

SUMMARY OF INVENTION

A synthetic single crystal diamond according to an aspect of the present disclosure contains nitrogen, and in an X-ray absorption fine structure spectrum thereof, a ratio $I_{405}/I_{412}$ between an intensity $I_{405}$ of a peak which appears at an energy of 405±1 eV and has a full width at ¾ maximum of 3 eV or more and an intensity $I_{412}$ of a peak which appears at an energy of 412±2 eV is less than 1.5.

A tool according to an aspect of the present disclosure includes the synthetic single crystal diamond mentioned above.

A method of manufacturing a synthetic single crystal diamond according to an aspect of the present disclosure includes:

a first step of preparing a diamond single crystal containing nitrogen by a temperature difference process using a metal solvent;

a second step of irradiating the diamond single crystal with one or both of an electron beam and a particle beam so as to apply an energy of 100 MGy or more and 1000 MGy or less to the diamond single crystal; and a third step of heat-treating the diamond single crystal obtained in the second step so as to obtain a synthetic single crystal diamond, the third step includes:

a step 3a of placing the diamond single crystal obtained in the second step in a vacuum atmosphere or an inert gas atmosphere, and raising a temperature of the atmosphere to a first temperature of 1750° C. or more and 2000° C. or less under a pressure not higher than normal pressure;

a step 3b of maintaining the temperature of the atmosphere raised to the first temperature at a second temperature within a range of the first temperature±10° C. for 1 minute or more and 30 minutes or less; and a step 3c of lowering the temperature of the atmosphere maintained at the second temperature to 1000° C. or less, in the step 3a, the temperature of the atmosphere is raised from 1000° C. to the first temperature in 1 minute or more and 30 minutes or less, and in the step 3c, the temperature of the atmosphere is lowered from the second temperature to 1000° C. in 1 minute or more and 15 minutes or less.

DETAILED DESCRIPTION

Figure 1:
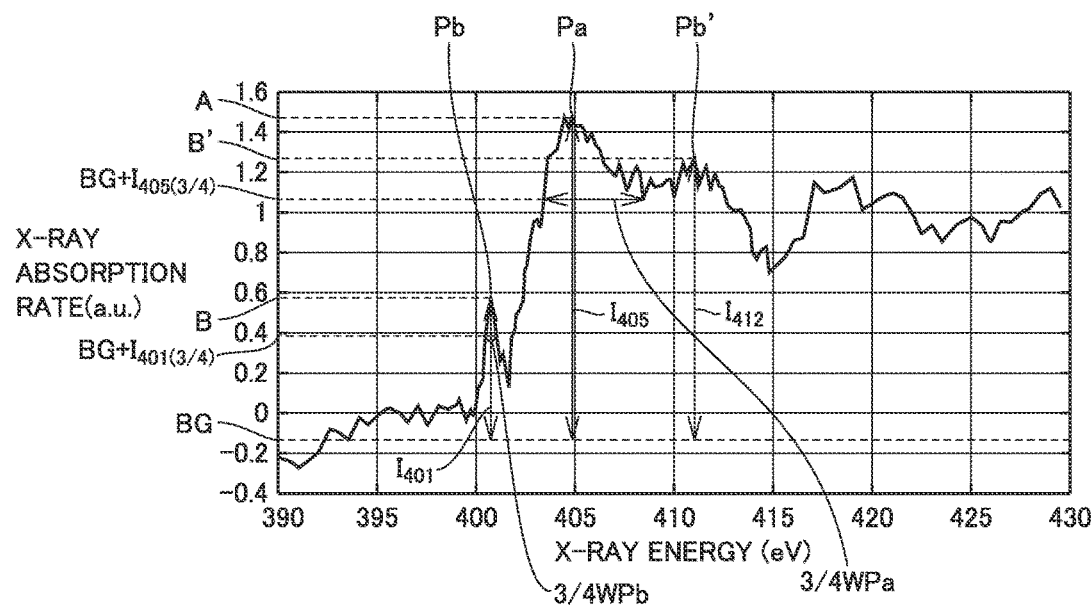
FIG. 1 is a diagram illustrating an example XAFS spectrum of a synthetic single crystal diamond according to a first embodiment.

Problem to be Solved by the Present Disclosure

The synthetic diamond described in PTL 1 and NPL 1 is insufficient in hardness, and thus, when a tool including the synthetic diamond is used in cutting, the tool is likely to be chipped off.

Therefore, an object of the present invention is to provide a synthetic single crystal diamond having high hardness and excellent chipping resistance, a tool including the same, and a method of producing the synthetic single crystal diamond.

Advantageous Effect of the Present Disclosure

According to the present disclosure, it is possible to provide a synthetic single crystal diamond having high hardness and excellent chipping resistance, and a tool including the same.

DESCRIPTION OF EMBODIMENTS

First, each aspect of the present disclosure will be described.

(1) A synthetic single crystal diamond according to an aspect of the present disclosure is a synthetic single crystal diamond containing nitrogen, in an X-ray absorption fine structure spectrum thereof, a ratio $I_{405}/I_{412}$ between an intensity $I_{405}$ of a peak which appears at an energy of 405±1 eV and has a full width at ¾ maximum of 3 eV or more and an intensity $I_{412}$ of a peak which appears at an energy of 412±2 eV is less than 1.5.

The synthetic single crystal diamond of the present disclosure can have high hardness and excellent chipping resistance.

(2) The ratio $I_{405}/I_{412}$ is preferably 1.33 or less.

Thus, the synthetic single crystal diamond can have even higher hardness and excellent chipping resistance.

(3) In the X-ray absorption fine structure spectrum thereof, a ratio $I_{401}/I_{405}$ between an intensity $I_{401}$ of a peak which appears at an energy of 401±1 eV and has a full width at ¾ maximum of less than 1.5 eV and the intensity $I_{405}$ is preferably greater than 0.2.

Thus, the synthetic single crystal diamond can have even higher hardness and excellent chipping resistance.

(4) The concentration of nitrogen atoms in the synthetic single crystal diamond is preferably 1 ppm or more and 3000 ppm or less.

Thus, the synthetic single crystal diamond can have even higher hardness and excellent chipping resistance.

(5) Preferably, the synthetic single crystal diamond includes one or more first regions, each of which includes one or both of non-diamond and vacancies, and the maximum diameter of each of the first regions is 0.1 μm or more and 40 μm or less.

Thus, the synthetic single crystal diamond can have excellent fracture strength and chipping resistance.

(6) In a fracture strength test in which a spherical diamond indenter having a tip radius of 50 μm is pressed against a surface of the synthetic single crystal diamond at a loading speed of 100 N/min, the synthetic single crystal diamond preferably has a cracking load greater than 20 N.

If the cracking load is greater than 20 N, the synthetic single crystal diamond has excellent fracture strength and chipping resistance. Therefore, when the synthetic single crystal diamond is used as a material in a tool, the tool can cut any difficult-to-cut hard material without causing the chipping of the cutting edge.

(7) The synthetic single crystal diamond preferably has a Knoop hardness of 100 GPa or more in a <100> direction on a {100} plane.

Thus, the wear resistance of the synthetic single crystal diamond is improved.

(8) A tool according to an aspect of the present disclosure includes the synthetic single crystal diamond described above.

Therefore, the tool can have high hardness and excellent chipping resistance.

(9) A method of producing a synthetic single crystal diamond according to an aspect of the present disclosure is a method of producing the synthetic single crystal diamond described above. The method includes:

a first step of preparing a diamond single crystal containing nitrogen by a temperature difference process using a metal solvent;

a second step of irradiating the diamond single crystal with one or both of an electron beam and a particle beam so as to apply an energy of 100 MGy or more and 1000 MGy or less to the diamond single crystal; and a third step of heat-treating the diamond single crystal obtained in the second step so as to obtain a synthetic single crystal diamond, the third step includes:

a step 3a of placing the diamond single crystal obtained in the second step in a vacuum atmosphere or an inert gas atmosphere, and raising a temperature of the atmosphere to a first temperature of 1750° C. or more and 2000° C. or less under normal pressure;

a step 3b of maintaining the temperature of the atmosphere raised to the first temperature at a second temperature within a range of the first temperature±10° C. for 1 minute or more and 30 minutes or less; and a step 3c of lowering the temperature of the atmosphere maintained at the second temperature to 1000° C. or less, in the step 3a, the temperature of the atmosphere is raised from 1000° C. to the first temperature in 1 minute or more and 30 minutes or less, and in the step 3c, the temperature of the atmosphere is lowered from the second temperature to 1000° C. in 1 minute or more and 15 minutes or less.

Thus, the synthetic single crystal diamond according to one aspect of the present disclosure can be obtained.

DETAILS OF EMBODIMENTS OF THE PRESENT DISCLOSURE

In the present specification, the expression in the form of "A to B" refers to an upper limit and a lower limit of a range (in other words, A or more and B or less), and if A is described with no unit but B is described with a unit, it means that A and B have the same unit.

In the present specification, a generic plane orientation including any crystallographically equivalent plane orientation is indicated by { }, and a generic direction including any crystallographically equivalent direction is indicated by < >.

First, in order to further understand the synthetic single crystal diamond of the present disclosure, nitrogen atoms present in the single crystal diamond, which serve as one of the main factors for determining the quality of the single crystal diamond, will be described. The nitrogen atoms in the single crystal diamond, depending on the form of presence, may be classified into isolated substitutional nitrogen atoms, interstitial nitrogen atoms, aggregated nitrogen atoms, and the like.

Isolated substitutional nitrogen atoms refer to those atoms that each replaces a carbon atom in a diamond crystal and is present at the position of the carbon atom as an atomic unit. Diamonds containing isolated substitutional nitrogen atoms are divided into type Ib diamond, type IIa diamond and type IIb diamond. Isolated substitutional nitrogen atoms do not greatly affect the crystal structure of the single crystal diamond, and therefore will not contribute to the suppression of crack propagation.

Interstitial nitrogen atoms refer to those atoms that are located away from lattice points of carbon atoms in the diamond structure and positioned at an intermediate point between lattice points. Interstitial nitrogen atoms can suppress crack propagation in a single crystal diamond.

Aggregated nitrogen atoms refer to those atoms that are present in diamond crystal as an aggregation of two or more nitrogen atoms. Aggregated nitrogen atoms can suppress crack propagation in a single crystal diamond.

Aggregated nitrogen atoms may be further classified into 2-nitrogen atom pair, 2N-V (N represents a nitrogen atom, and V represents an atomic vacancy. The same applies hereinafter), 3N-V, 4N-V, 1N-V-N, 2N-V-N, 3N-V-N, 4N-V-N, 4-nitrogen atom aggregation, platelet, and the like. In particular, 2N-V-N, 3N-V-N, and 4N-V-N are highly effective in suppressing crack propagation.

2-nitrogen atom pair refers to two nitrogen atoms that are covalently bonded and replace corresponding carbon atoms. A diamond that contains 2-nitrogen atom pairs is called type IaA diamond.

2N-V refers to two nitrogen atoms that aggregate around an atomic vacancy and lie adjacent to the atomic vacancy.

2N-V-N refers to those atoms including two nitrogen atoms that aggregate around an atomic vacancy and lie adjacent to the atomic vacancy, and another nitrogen atom that is present at a lattice point adjacent to one of the two nitrogen atoms. The nitrogen atom adjacent to one nitrogen atom of 2N-V contributes to the suppression of crack propagation.

3N-V-N refers to those atoms including three nitrogen atoms that aggregate around an atomic vacancy and lie adjacent to the atomic vacancy, and another nitrogen atom that is present at a lattice point adjacent to one of the three nitrogen atoms. The nitrogen atom adjacent to one nitrogen atom of 3N-V contributes to the suppression of crack propagation.

4N-V-N refers to those atoms including four nitrogen atoms that aggregate around an atomic vacancy and lie adjacent to the atomic vacancy, and another nitrogen atom that is present at a lattice point adjacent to one of the four nitrogen atoms. The nitrogen atom adjacent to one nitrogen atom of 4N-V contributes to the suppression of crack propagation.

3N-V refers to three nitrogen atoms that lie adjacent to an atomic vacancy and replace corresponding carbon atoms, and it is also called a N3 center.

4-nitrogen atom aggregation refers to four nitrogen atoms that lie adjacent to an atomic vacancy and replace corresponding carbon atoms. A diamond that contains 4-nitrogen atom aggregations is called type IaB diamond.

A platelet refers to five or more nitrogen atoms that lie adjacent to an atomic vacancy and replace corresponding carbon atoms. A diamond that contains platelets is called type IaB' diamond.

The content of nitrogen atoms present in the single crystal diamond in each form can be determined by X-ray absorption fine structure (XAFS) analysis.

Specifically, a single crystal diamond containing isolated substitutional nitrogen atoms and 2-nitrogen atom pairs exhibits a peak at an energy of about 405 eV (for example, 405±1 eV) in an X-ray absorption fine structure spectrum (hereinafter also referred to as "XAFS spectrum").

A single crystal diamond containing 2N-V, 3N-V-N, 4N-V-N, and interstitial N exhibits a peak at an energy of about 412 eV (for example, 412±2 eV) in the XAFS spectrum.

A single crystal diamond containing 3N-V-N, 4N-V-N, and interstitial N further exhibits a peak at at an energy of about 401 eV (for example, 401±1 eV) in the XAFS spectrum.

The ratio between the intensity of the peak at an energy of about 405 eV, the intensity of the peak at an energy of about 412 eV, and the intensity of the peak at an energy of about 401 eV represents the content of nitrogen atoms in each form of presence which contribute to the intensity of each peak. Therefore, based on the XAFS spectrum of the single crystal diamond, it is possible to determine the content of nitrogen atoms present in the single crystal diamond in each form.

<First Embodiment: Synthetic Single Crystal Diamond>

A synthetic single crystal diamond according to an aspect of the present disclosure (hereinafter also referred to as "synthetic single crystal diamond of the first embodiment") is a synthetic single crystal diamond that contains nitrogen, and in an X-ray absorption fine structure spectrum thereof, a ratio $I_{405}/I_{412}$ between an intensity $I_{405}$ of a peak which appears at an energy of 405±1 eV and has a full width at ¾ maximum of 3 eV or more and an intensity $I_{412}$ of a peak which appears at an energy of 412±2 eV is less than 1.5.

The synthetic single crystal diamond of the first embodiment can have high hardness and excellent chipping resistance. The possible reason will be described in the following.

$I_{405}$ represents the intensity of a peak derived from isolated substitutional nitrogen atoms and 2-nitrogen atom pairs, and $I_{412}$ represents the intensity of a peak derived from 2N-V, 3N-V-N, 4N-V-N and interstitial N. Therefore, $I_{405}/I_{412}$ is positively correlated with the ratio of the total number of nitrogen atoms present as isolated substitutional nitrogen atoms and 2-nitrogen atom pairs to the total number of nitrogen atoms present as 2N-V, 3N-V-N, 4N-V-N and interstitial N in the synthetic single crystal diamond. Therefore, the smaller the value of $I_{405}/I_{412}$, the smaller the ratio of isolated substitutional nitrogen atoms which do not contribute to the suppression of crack propagation to the total number of nitrogen atoms in the synthetic single crystal diamond.

After intensive studies, the present inventors have found that the synthetic single crystal diamond has high hardness and excellent chipping resistance when $I_{405}/I_{412}$ is less than 1.5. Specifically, when $I_{405}/I_{412}<1.5$ is satisfied, the ratio of isolated substitution nitrogen atoms which do not contribute to the suppression of crack propagation to the total number of nitrogen atoms in the synthetic single crystal diamond is small, in other words, the ratio of aggregated nitrogen atoms which can suppress the crack propagation is large, and thereby, it is assumed that the synthetic single crystal diamond can have high hardness and excellent chipping resistance.

When a full width at ¾ maximum of the peak at the energy 405±1 eV of the single crystal diamond is 3 eV or more, the peak intensity of the sharp peak at the energy 405±1 eV where the full width at ¾ maximum of the peak is 1 eV is less than 1% as compared with the case where the type Ib diamond is 100%. In other words, it is assumed that when the ratio of isolated substitutional nitrogen atoms present in the synthetic single crystal diamond is less than 1%, the synthetic single crystal diamond is enabled to have chipping resistance. In the present specification, the full width at ¾ maximum of the peak which appears at an energy of 405±1 eV means an energy difference between two points at ¾ of the maximum intensity of the peak which appears at an energy of 405±1 eV in the XAFS spectrum.

In the synthetic single crystal diamond of the first embodiment, $I_{405}/I_{412}$ is less than 1.5. The upper limit of $I_{405}/I_{412}$ is less than 1.5, preferably 1.33 or less, more preferably 1.3 or less, and even more preferably 1.2 or less. The lower limit of $I_{405}/I_{412}$ is not particularly limited, and is preferably 0.8 or more, and more preferably 0.9 or more, for example. $I_{405}/I_{412}$ is preferably 0.8 or more and less than 1.5, more preferably 0.8 or more and 1.33 or less, even more preferably 0.9 or more and 1.3 or less, and further preferably 0.9 or more and 1.2 or less.

The lower limit of the full width at ¾ maximum of the peak which appears at an energy of 405±1 eV is 3 eV or more, and preferably 4 eV or more. The upper limit of the full width at ¾ maximum of the peak which appears at an energy of 405±1 eV may be, for example, 12 eV or less. The full width at ¾ maximum of the peak which appears at an energy of 405±1 eV is preferably 3 eV or more and 12 eV or less, and more preferably 4 eV or more and 12 eV or less.

In the X-ray absorption fine structure of the synthetic single crystal diamond according to the present embodiment, a ratio $I_{401}/I_{405}$ between an intensity $I_{401}$ of a peak which appears at an energy of 401±1 eV and has a full width at ¾ maximum of less than 1.5 eV and the intensity $I_{405}$ is preferably greater than 0.2.

Thus, the synthetic single crystal diamond can have even higher hardness and excellent chipping resistance. The possible reason will be described in the following.

$I_{401}$ represents the intensity of a peak derived from 3N-V-N, 4N-V-N and interstitial N, and $I_{405}$ represents the intensity of a peak derived from isolated substitutional nitrogen atoms and 2-nitrogen atom pairs. Therefore, $I_{401}/I_{405}$ represents the ratio of the total number of nitrogen atoms present as 3N-V-N, 4N-V-N and the interstitial N to the total number of isolated substitutional nitrogen atoms and 2-nitrogen atom pairs present in the synthetic single crystal diamond. Therefore, the larger the value of $I_{401}/I_{405}$, the larger the ratio of nitrogen atoms contributing to the suppression of crack propagation to the total number of nitrogen atoms in the synthetic single crystal diamond.

When the full width at ¾ maximum of the peak which appears at an energy of 401±1 eV is less than 1.5 eV, it indicates that nitrogen atoms are either present directly adjacent to the defect of 3N-V or the defect of 4N-V or present at interstitial positions. In the present specification, the full width at ¾ maximum of the peak which appears at an energy of 401±1 eV means an energy difference between two points at ¾ of the maximum intensity of the peak which appears at an energy of 401±1 eV in the XAFS spectrum.

After intensive studies, the present inventors have found that when $I_{401}/I_{405}$ is greater than 0.2 and the full width at ¾ maximum of the peak which appears at an energy of 401±1 eV is less than 1.5 eV, the synthetic single crystal diamond has even higher hardness and excellent chipping resistance. In other words, when $I_{401}/I_{405}>0.2$ and the full width at ¾ maximum of the peak which appears at an energy of 401±1 eV is less than 1.5 eV, the ratio of aggregated nitrogen atoms capable of suppressing the crack propagation among the total number of nitrogen atoms present in the synthetic single crystal diamond is large enough to further suppress the crack propagation, and thereby, it is assumed that the synthetic single crystal diamond can have even higher hardness and excellent chipping resistance.

The lower limit of $I_{401}/I_{405}$ is preferably greater than 0.09, more preferably greater than 0.2, and even more preferably 0.24 or more. On the other hand, the upper limit of $I_{401}/I_{405}$ is not particularly limited, and is preferably 1.0 or less, and more preferably 0.6 or less, for example. $I_{401}/I_{405}$ is preferably greater than 0.09 and equal to or less than 1.0, more preferably greater than 0.2 and equal to or less than 1.0, and even more preferably equal to or greater than 0.24 and equal to or less than 0.6.

The upper limit of the full width at ¾ maximum of the peak which appears at an energy of 401±1 eV is preferably less than 1.5 eV, and more preferably 1.0 eV or less. The lower limit of the full width at ¾ maximum of the peak which appears at an energy of 401±1 eV may be 0.1 eV or more, for example. The full width at ¾ maximum of the peak which appears at an energy of 401±1 eV is preferably 0.1 eV or more and less than 1.5 eV, and more preferably 0.2 eV or more and 1.0 eV or less.

(X-Ray Absorption Fine Structure)

In the present specification, the X-ray absorption fine structure (XAFS) spectrum is obtained by using the following radiation light equipment, conditions and measurement methods:

Radiation light equipment: soft X-ray beamline, BL17, in Kyushu Synchrotron Light Research Center;

Conditions: the energy of X-ray is 390 eV or more and 430 eV or less, the irradiation angle of X-ray is 45°, and the spot size of X-ray is 0.05 mm×1 mm; and XAFS measurement methods: fluorescent X-ray yield measurement method (for bulk measurement and trace element measurement), and sample current measurement method (for surface measurement).

In the present specification, the peak intensity $I_{401}$, the peak intensity $I_{405}$, and the peak intensity $I_{412}$ are defined as the values in the following, respectively. It should be noted that the peak fitting is not performed, and in addition, an average value of X-ray absorption rate at 390 eV to 395 eV is defined as a background value (hereinafter also referred to as "BG").

$I_{401}$ is a value obtained by subtracting the BG value from the X-ray absorption rate at the position of the peak which appears at an energy of 401±1 eV and has a full width at ¾ maximum of less than 1.5 eV.

$I_{405}$ is a value obtained by subtracting the BG value from the X-ray absorption rate at the position of the peak which appears at an energy of 405±1 eV and has a full width at ¾ maximum of 3 eV or more.

$I_{412}$ is a value obtained by subtracting the BG value from the X-ray absorption rate at the position of the peak which appears at an energy of 412±2 eV.

When a peak cannot be clearly confirmed at an energy of 401±1 eV, 405±1 eV, and 412±2 eV, respectively, a maximum value within each energy range is regarded as the X-ray absorption rate at the position of the peak within that energy range.

An example XAFS spectrum of the synthetic single crystal diamond of the first embodiment is illustrated in FIG. 1. In the XAFS spectrum of FIG. 1, the horizontal axis represents X-ray energy (eV), and the vertical axis represents normalized X-ray absorption rate (arbitrary unit: a.u.).

In FIG. 1, a peak which appears at an energy of 401±1 eV is indicated as Pb (hereinafter also referred to as "peak Pb"), a peak which appears at an energy of 405±1 eV is indicated as Pa (hereinafter also referred to as "peak Pa"), and a peak which appears at an energy of 412±2 eV is indicated as Pb' (hereinafter also referred to as "peak Pb").

In FIG. 1, the full width at ¾ maximum of the peak Pb is obtained as follows. First, the value of $I_{401}$ is obtained by subtracting BG from the X-ray absorption rate B of the peak Pb. Next, the ¾ value of $I_{401}$, i.e., $I_{401(3/4)}$ is obtained. Then, $BG+I_{401(3/4)}$ is obtained. In the XAFS spectrum of FIG. 1, the width ¾ WPb of the peak at X-ray absorption rate $BG+I_{401(3/4)}$ is determined. The width ¾ WPb corresponds to the full width at ¾ maximum of the peak Pb. In FIG. 1, the full width at ¾ maximum of the peak Pb is less than 1.5 eV.

In FIG. 1, the full width at ¾ maximum of the peak Pa is obtained as follows. First, the value of $I_{405}$ is obtained by subtracting the BG value from the X-ray absorption rate A of the peak Pa. Next, the ¾ value of $I_{405}$, i.e., $I_{405(3/4)}$ is obtained. Then, $BG+I_{405(3/4)}$ is obtained. In the XAFS spectrum of FIG. 1, the width ¾ WPa of the peak at X-ray absorption rate $BG+I_{405(3/4)}$ is determined. The width ¾ WPa corresponds to the full width at ¾ maximum of the peak Pa. In FIG. 1, the full width at ¾ maximum of the peak Pa is 3 eV or more.

The value obtained by subtracting the BG value from the X-ray absorption rate B of the peak Pb which appears at an energy of 401±1 eV is indicated as $I_{401}$, the value obtained by subtracting the BG value from the X-ray absorption rate of the peak Pa which appears at an energy of 405±1 eV is indicated as $I_{405}$, and the value obtained by subtracting the BG value from the X-ray absorption rate of the peak Pb' which appears at an energy of 412±2 eV is indicated as $I_{412}$.

(Concentration of Nitrogen Atoms)

The synthetic single crystal diamond of the first embodiment preferably contains nitrogen atoms at a concentration of 1 ppm or more and 3000 ppm or less. The concentration of nitrogen atoms in the synthetic single crystal diamond may be measured by secondary ion mass spectrometry (SIMS).

When the concentration of nitrogen atoms is 1 ppm or more and 3000 ppm or less, the nitrogen atoms are likely to aggregate so as to form aggregated nitrogen atoms, which makes it possible for the synthetic single crystal diamond to have high hardness and excellent chipping resistance.

The lower limit of the concentration of nitrogen atoms in the synthetic single crystal diamond is 1 ppm or more, preferably 20 ppm or more, and more preferably 200 ppm or more. On the other hand, the upper limit of the concentration of nitrogen atoms in the synthetic single crystal diamond is 3000 ppm or less, preferably 2200 ppm or less, and more preferably 1500 ppm or less. The concentration of nitrogen atoms in the synthetic single crystal diamond is 1 ppm or more and 3000 ppm or less, preferably 20 ppm or more and 2200 ppm or less, and more preferably 200 ppm or more and 1500 ppm or less.

(First Region)

The synthetic single crystal diamond of the first embodiment preferably includes one or more first regions, each of which includes one or both of non-diamond and vacancies (macroscopic vacancies), and the maximum diameter of each of the first regions is preferably 0.1 μm or more and 40 μm or less. Thus, the synthetic single crystal diamond has excellent fracture strength and chipping resistance. Therefore, when the synthetic single crystal diamond is used as a material in a tool, the tool can cut any difficult-to-cut hard material without causing the chipping of the cutting edge.

In the present specification, one or more first regions, each of which includes one or both of non-diamond and vacancies, may include one or both of non-diamond and vacancies having a size of at least 100 nm or more, instead of an atomic level size such as 2N-V (N represents a nitrogen atom, and V represents an atomic vacancy. The same applies hereinafter), 3N-V-N, 4N-V-N, interstitial N, or 4-nitrogen atom aggregation. The presence or absence of the first region can be confirmed using an optical microscope, an electron microscope, a positron annihilation method, an EDX method, an X-ray diffraction method, or the like.

The non-diamond may be at least one element selected from a group consisting of titanium (Ti), vanadium (V), chromium (Cr), manganese (Mn), iron (Fe), nickel (Ni), cobalt (Co), copper (Cu), Zirconium (Zr), niobium (Nb), molybdenum (Mo), ruthenium (Ru), rhodium (Rh), palladium (Pd), hafnium (Hf), tantalum (Ta), tungsten (W), osmium (Os), iridium (Ir) and platinum (Pt); at least one alloy containing two or more elements selected from the abovementioned group; a compound composed of at least one element selected from the abovementioned group and carbon (C) or oxygen (O); and at least one composite selected from a group consisting of composites containing at least one element, at least one alloy and the compound.

The maximum diameter of each of the first regions is preferably 0.1 μm or more and 40 μm or less. In the present specification, the maximum diameter of the first region refers to a linear distance between two points that are the most distant on the outer circumference of the first region having a certain size and shape. The lower limit of the maximum diameter of each first region is preferably 0.1 μm or more, more preferably 0.5 μm or more, and even more preferably 1 μm or more. The upper limit of the maximum diameter of each first region is preferably 40 μm or less, and more preferably 30 μm or less. The maximum diameter of each first region is preferably 0.1 μm or more and 40 μm or less, more preferably 0.5 μm or more and 40 μm or less, and even more preferably 1 μm or more and 30 μm or less.

The maximum diameter of each first region in the synthetic single crystal diamond is measured by the following method. Five measurement fields, each of which has a size of 100×100 μm² or of 500×500 μm², are defined respectively at five positions including a central portion and four corners of the sample surface. Each of the five measurement fields is observed by using an electron microscope so as to measure the maximum diameter of each first region in each measurement field.

(Fracture Strength)

Preferably, the synthetic single crystal diamond of the first embodiment has a cracking load greater than 20 N in a fracture strength test in which a spherical diamond indenter having a tip radius (R) of 50 μm is pressed against a surface of the synthetic single crystal diamond at a loading speed of 100 N/min. If the cracking load is greater than 20 N, the synthetic single crystal diamond has excellent breaking strength and chipping resistance, and when it is used as a material in a tool, the tool can cut any difficult-to-cut hard material without causing the chipping of the cutting edge.

The lower limit of the cracking load is preferably greater than 20 N, more preferably 25 N or more, and even more preferably 30 N or more. The upper limit of the cracking load is not particularly limited, but is preferably 50 N or less from the viewpoint of production. The cracking load is preferably greater than 20 N and 50 N or less, more preferably 25 N or more and 50 N or less, and even more preferably 30 N or more and 50 N or less.

The fracture strength test is performed under the following conditions. A spherical diamond indenter with a tip radius (R) of 50 μm is pressed against the sample, a load is applied to the sample at a loading speed of 100 N/min, and the load at the moment when a crack occurs in the sample (cracking load) is measured. The moment when a crack occurs is measured using an AE sensor. The larger the cracking load, the higher the hardness of the sample and the better the chipping resistance.

When an indenter with a tip radius (R) smaller than 50 μm is used as the measuring indenter, the sample is plastically deformed before a crack is generated, and the strength against cracks may not be measured accurately. On the contrary, an indenter with a tip radius (R) larger than 50 μm may be used to perform the measurement, but in this case, a greater load is required until a crack occurs and the contact area between the indenter and the sample increases, which may affect the measurement accuracy due to the surface accuracy of the sample and may greatly affect the crystal orientation of the crystal. Therefore, it is preferable to use an indenter with a tip radius (R) of 50 μm in the fracture strength test for a synthetic single crystal diamond.

(Knoop Hardness)

The synthetic single crystal diamond of the first embodiment preferably has a Knoop hardness of 100 GPa or more in the <100> direction on the {001} plane. A synthetic single crystal diamond having a Knoop hardness of 100 GPa or more has higher hardness and superior wear resistance than natural diamond containing nitrogen.

The lower limit of the Knoop hardness is 100 GPa, and preferably 110 GPa. The upper limit of the Knoop hardness is preferably 130 GPa. The Knoop hardness is preferably 100 GPa or more and 130 GPa or less, and more preferably 110 GPa or more and 130 GPa or less.

A method of determining the Knoop hardness (hereinafter also referred to as HK having a unit of GPa) will be described. The Knoop hardness is determined in accordance with "JIS Z 2251:2009 Knoop hardness test-Test method". First, a Knoop indenter made of synthetic diamond is pressed against the synthetic single crystal diamond in the <100> direction on the {001} plane with a load F(=4.9 N) to make an indentation. The length "a" (μm) of a longer diagonal line of the obtained indentation is measured, and the Knoop hardness (HK) is calculated from the following equation (1).

$$HK = 14229 \times F/a^2 \quad (1)$$

<Second Embodiment: Tool>

A tool according to an embodiment of the present disclosure is a tool including the synthetic single crystal diamond of the first embodiment. The synthetic single crystal diamond of the present disclosure has high hardness and excellent chipping resistance, and is stable in quality. Therefore, the tool including the synthetic single crystal diamond of the present disclosure is excellent in wear resistance and chipping resistance, and thereby can perform stable machining for a longer time and has a longer tool life than a tool produced from a conventional synthetic diamond, natural diamond or a diamond sintered body.

Examples of the tool include a wear-resistant tool such as a dresser, a wire drawing die, a scribe tool or a water jet orifice, or a cutting tool such as a precision cutting tool or a wood cutter.

<Third Embodiment: Method of Producing Synthetic Single Crystal Diamond>

A method of producing a synthetic single crystal diamond according to an embodiment of the present disclosure is a method of producing the synthetic single crystal diamond according to the first embodiment, the method includes: a first step of preparing a diamond single crystal containing nitrogen atom at a concentration of 1 ppm or more and 3000 ppm or less by a temperature difference process using a metal solvent; a second step of irradiating the diamond single crystal with one or both of an electron beam and a particle beam so as to apply an energy of 100 MGy or more and 1000 MGy or less to the diamond single crystal; and a third step of heat-treating the diamond single crystal obtained in the second step so as to obtain a synthetic single crystal diamond. The third step includes: a step 3a of placing the diamond single crystal obtained in the second step in a vacuum atmosphere or an inert gas atmosphere, and raising a temperature of the atmosphere to a first temperature of 1750° C. or more and 2000° C. or less under normal pressure; a step 3b of maintaining the temperature of the atmosphere raised to the first temperature at a second temperature within a range of the first temperature±10° C. for 1 minute or more and 30 minutes or less; and a step 3c of lowering the temperature of the atmosphere maintained at the second temperature to 1000° C. or less. In the step 3a, the temperature of the atmosphere being raised from 1000° C. to the first temperature in 1 minute or more and 30 minutes or less, and in the step 3c, the temperature of the atmosphere being lowered from the second temperature to 1000° C. in 1 minute or more and 15 minutes or less.

(First Step)

Figure 2:
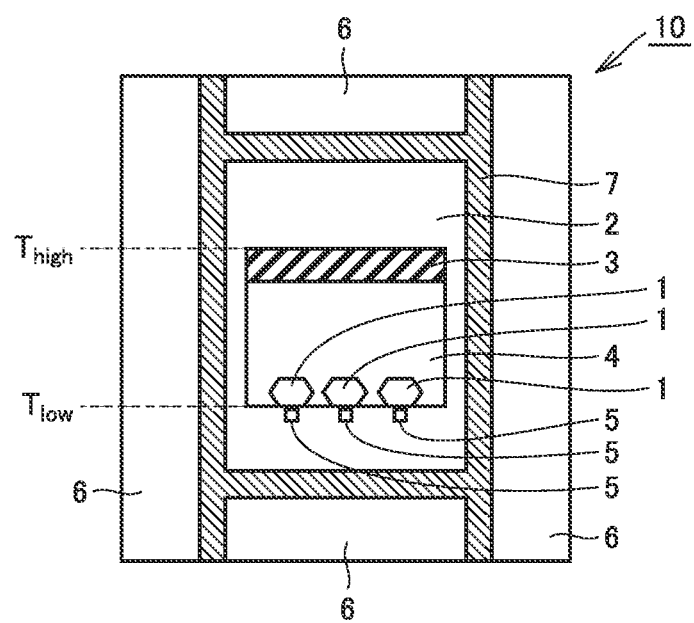
FIG. 2 is a schematic cross-sectional view illustrating an example configuration of a sample chamber used for producing the synthetic single crystal diamond of the present disclosure.

The diamond single crystal can be produced by a temperature differential method in a sample chamber having a configuration illustrated in FIG. 2, for example.

As illustrated in FIG. 2, in a sample chamber 10 used for the production of the diamond single crystal, an insulator 2, a carbon source 3, a solvent metal 4 and seed crystals 5 are disposed in a space surrounded by a graphite heater 7, and a pressure medium 6 is disposed outside the graphite heater 7. The temperature difference process is a synthesis process in which a temperature gradient in the vertical direction is provided inside the sample chamber 10, the carbon source 3 is disposed in a high temperature portion ($T_{high}$) and the seed crystals 5 are disposed in a low temperature portion ($T_{low}$), the solvent metal 4 is disposed between the carbon source 3 and the seed crystals 5, the temperature of the sample chamber is maintained equal to or high than a temperature at which the solvent metal 4 is dissolved, and the pressure of the sample chamber is maintained equal to or high than a pressure at which the diamond is thermally stable so as to grow a diamond single crystal on each of the seed crystals 5.

As the carbon source 3, diamond powder is preferably used. In addition, graphite (black lead) or pyrolytic carbon may also be used. As the solvent metal 4, at least one metal selected from iron (Fe), cobalt (Co), nickel (Ni), manganese (Mn) and the like, or an alloy containing these metals may be used.

The carbon source 3 or the solvent metal 4 may include a nitrogen source which is added as a simple substance or a mixture of, for example, a nitride such as iron nitride ($Fe_2N$, $Fe_3N$), aluminum nitride (AlN), phosphorus nitride ($P_3N_4$) or silicon nitride ($Si_3N_4$), or an organic nitrogen compound such as melamine or sodium azide. Thereby, the synthesized diamond single crystal may contain nitrogen atoms, and the nitrogen atoms are present in the diamond single crystal mainly as isolated substitutional nitrogen atoms.

The content of the nitrogen source in the carbon source 3 or the solvent metal 4 may be adjusted in such a manner that the concentration of nitrogen atoms in the synthesized diamond single crystal is 1 ppm or more and 3000 ppm or less. For example, regarding the carbon source, the content of nitrogen atoms derived from the nitrogen source may be adjusted to 10 ppm or more and 5000 ppm or less. However, in the case of adjusting the concentration of nitrogen atoms in the diamond single crystal to 50 ppm or less, the amount of Al elements which serve as a getter should be controlled in the range of 10 ppm or more and 100 ppm or less. Regarding the solvent metal, for example, when the solvent metal is an alloy of iron-cobalt-nickel and the nitrogen source is $Fe_3N$, the content of the nitrogen source may be adjusted to 0.005 mass % or more and 0.1 mass % or less.

The solvent metal 4 may further contain at least one element selected from the group consisting of titanium (Ti), vanadium (V), chromium (Cr), manganese (Mn), copper (Cu), zirconium (Zr), niobium (Nb), molybdenum (Mo), ruthenium (Ru), rhodium (Rh), hafnium (Hf), tantalum (Ta), tungsten (W), osmium (Os), iridium (Ir), and platinum (Pt).

(Second Step)

Next, the diamond single crystal obtained in the first step is irradiated with one or both of an electron beam and a particle beam with an energy of 100 MGy or more and 1000 MGy or less. As a result, lattice defects are introduced into the diamond single crystal to form vacancies.

If the irradiation amount of energy is less than 100 MGy, the number of lattice defects introduced may be insufficient. On the contrary, if the irradiation amount of energy is greater than 1000 MGy, excessive vacancies may be formed, which may greatly deteriorate the crystallinity. Therefore, the irradiation amount of energy is preferably 100 MGy or more and 1000 MGy or less.

As the particle beam, a neutron beam or a proton beam may be used. The irradiation conditions are not particularly limited as long as the amount of energy applied to the diamond single crystal is 100 MGy or more and 1000 MGy or less. For example, when an electron beam is used, the irradiation energy may be 4.6 MeV or more and 4.8 MeV or less, the current may be 2 mA or more and 5 mA or less, and the irradiation time may be 30 hours or more and 45 hours or less.

(Third Step)

Next, the diamond single crystal obtained in the second step is subjected to heat treatment to obtain a synthetic single crystal diamond.

Specifically, first, the diamond single crystal obtained in the second step is placed in a vacuum atmosphere or an inert gas atmosphere, and the temperature of the atmosphere is raised to a first temperature of 1750° C. or more and 2000° C. or less under a pressure not higher than normal pressure (step 3a). In the step 3a, the temperature of the atmosphere is raised from 1000° C. to the first temperature in 1 minute or more and 30 minutes or less (hereinafter, the time required to raise the temperature of the atmosphere from 1000° C. to the first temperature is also referred to as "temperature-raising time"). The temperature-raising time is 1 minute or more and 30 minutes or less, and preferably 5 minutes or more and 25 minutes or less.

Next, the temperature of the atmosphere raised to the first temperature is maintained at a second temperature within a range of the first temperature±10° C. for 1 minute or more and 30 minutes or less (hereinafter referred to as "temperature-maintaining time") (step 3b). The temperature-maintaining time is preferably 1 minute or more and 30 minutes or less, and preferably 5 minutes or more and 25 minutes or less.

Then, the temperature of the atmosphere maintained at the second temperature is lowered to 1000° C. or less (step 3c). In the step 3c, the temperature of the atmosphere is lowered from the second temperature to 1000° C. in 1 minute or more and 15 minutes or less (hereinafter, the time required to lower the temperature of the atmosphere from the second temperature to 1000° C. is also referred to as "temperature-lowering time").

By setting the temperature-raising time to 1 minute or more and 30 minutes or less in the step 3a, the temperature-maintaining time to 1 minute or more and 30 minutes or less in the step 3b, and the temperature-lowering time to 1 minute or more and 15 minutes or less in the step 3c, the isolated substitutional nitrogen atoms in the diamond single crystal tend to move through the vacancies and become aggregated nitrogen atoms such as 2N-V, 3N-V-N, 4N-V-N, and interstitial N. Since the synthetic single crystal diamond obtained contains aggregated nitrogen atoms which can suppress crack propagation, the synthetic single crystal diamond can have high hardness and excellent chipping resistance.

EXAMPLES

The present disclosure will be described in more detail with reference to examples. However, the scope of the present disclosure is not limited to these examples.

<Production of Synthetic Single Crystal Diamond>

First, a diamond single crystal of each sample was synthesized in a sample chamber having a configuration illustrated in FIG. 2 by the temperature difference process using a solvent metal (first step).

Specifically, an alloy of iron-cobalt-nickel was prepared as the solvent metal, and to the solvent metal, iron nitride ($Fe_3N$) powder was added as a nitrogen source. The concentration of iron nitride in the solvent metal was 0.08 mass %.

Diamond powder was used as the carbon source, and about 0.5 mg of diamond single crystal was used as the seed crystal. The temperature in the sample chamber was adjusted by using a heater so that a temperature difference of several tens of degrees was created between a high temperature portion where the carbon source was disposed and a low temperature portion where the seed crystal was disposed. In addition, a ultrahigh pressure generator was used to control the pressure to 5.5 GPa and the temperature of the low temperature portion in the range of 1370° C.±10° C. (1360° C. to 1380° C.) for 60 hours, and thereby the diamond single crystal was synthesized on the seed crystal.

Next, the obtained diamond single crystal was irradiated with an electron beam (second step). The irradiation condition was set to include an irradiation energy of 4.6 MeV, a current of 2 mA, and an irradiation time of 30 hours. This irradiation condition is the same as the irradiation condition for applying an energy of 100 MGy to a diamond single crystal.

After the electron beam irradiation, the diamond single crystal was placed in a vacuum atmosphere, and the temperature of the atmosphere was raised, under a pressure not higher than normal pressure, to a temperature described in the column of "first temperature" of the "third step" by a time described in the column of "temperature-raising time" in Table 1 (step 3a). The temperature of the atmosphere was maintained at the second temperature within the range of the first temperature±10° C. for the time described in the column of "temperature-maintaining time" of the "third step" in Table 1 (step 3b). Next, the temperature of the atmosphere was firstly lowered from the second temperature to 1000° C. by the time described in the column of "temperature-lowering time" of the "third step" in Table 1, and then lowered to room temperature (step 3c).

Taking sample 1 as an example, the diamond single crystal after the electron beam irradiation was placed in a vacuum atmosphere, the temperature of the atmosphere was raised to 1760° C. (the first temperature) in 25 minutes (the temperature-raising time) under normal pressure (step 3a), the temperature was maintained at 1760±10° C. (the second temperature) for 22 minutes (the temperature-maintaining time), and then, the temperature was lowered from the second temperature to 1000° C. in 12 minutes (temperature-lowering time).

Through the above steps, the synthetic single crystal diamond of each sample was obtained.

[Sample 11]

Sample 11 is a synthetic single crystal diamond made of a diamond single crystal prepared from the same step as the first step of sample 1. Sample 11 was not subjected to the second step and the third step.

[Samples 12 to 14]

The synthetic single crystal diamond of samples 12 to 14 was produced in the same manner as sample 1 except that the energy applied to the diamond single crystal in the second step was changed to an energy listed in the column of "energy" of the "second step" in Table 1.

[Sample 15]

The synthetic single crystal diamond of sample 15 was produced in the same manner as sample 11 except that silicon nitride was used instead of iron nitride as the nitrogen source to be added to the solvent metal in the first step. The concentration of silicon nitride in the solvent metal was 0.008 mass %.

TABLE 1

| Sample | Second Step Energy (MGy) | Third Step Temperature-raising time in step 3a (min) | Third Step First temperature (° C.) | Third Step Temperature-maintaining time in step 3b (min) | Third Step Temperature-lowering time in step 3c (min) | Synthetic Single Crystal Diamond Concentration of N atoms (ppm) |
|---|---|---|---|---|---|---|
| 1 | 100 | 25 | 1760 | 22 | 12 | 400 |
| 2 | 100 | 25 | 1750 | 22 | 12 | 650 |
| 3 | 100 | 20 | 1800 | 18 | 10 | 900 |
| 4 | 100 | 25 | 1780 | 22 | 12 | 550 |
| 5 | 100 | 20 | 1850 | 18 | 10 | 480 |
| 6 | 100 | 27 | 1850 | 25 | 10 | 480 |
| 7 | 100 | 15 | 1920 | 12 | 7 | 800 |
| 8 | 100 | 10 | 1990 | 10 | 5 | 500 |
| 9 | 100 | 60 | 1700 | 60 | 60 | 350 |
| 10 | 100 | 60 | 1800 | 60 | 60 | 300 |
| 11 | — | — | — | — | — | 150 |
| 12 | 300 | 25 | 1760 | 22 | 12 | 450 |
| 13 | 500 | 25 | 1760 | 22 | 12 | 400 |
| 14 | 1000 | 25 | 1760 | 22 | 12 | 450 |
| 15 | — | — | — | — | — | 150 |

| Sample | Synthetic Single Crystal Diamond XAFS spectrum $I_{405}/I_{412}$ | Synthetic Single Crystal Diamond XAFS spectrum ¾ W of $I_{405}$ (eV) | Synthetic Single Crystal Diamond XAFS spectrum $I_{401}/I_{405}$ | Synthetic Single Crystal Diamond XAFS spectrum ¾ W of $I_{401}$ (eV) | First region Yes or No | First region Maximum diameter (μm) | Evaluation Knoop hardness (GPa) | Evaluation Cracking load (N) |
|---|---|---|---|---|---|---|---|---|
| 1 | 1.23 | 4.8 | 0.3 | 0.5 | No | — | 110 | 32 |
| 2 | 1.31 | 5.0 | 0.25 | 0.5 | No | — | 105 | 30 |
| 3 | 1.15 | 9.0 | 0.21 | 0.5 | Yes | 1.5 | 102 | 28 |
| 4 | 1.2 | 8.0 | 0.36 | 0.5 | No | — | 107 | 35 |
| 5 | 1.1 | 9.0 | 0.1 | 0.4 | No | — | 108 | 26 |
| 6 | 1.1 | 9.0 | 0 | — | No | — | 108 | 25 |
| 7 | 1.43 | 8.0 | 0.05 | 0.9 | Yes | 0.2 | 100 | 24 |
| 8 | 1.35 | 10.0 | 0 | — | No | — | 107 | 22 |
| 9 | 1.6 | 2.0 | 0.25 | 0.6 | No | — | 82 | 12 |
| 10 | 1.5 | 4.8 | 0 | — | Yes | 0.05 | 98 | 15 |
| 11 | 2 | 1.0 | 0.4 | 0.6 | No | — | 80 | 7 |
| 12 | 1.21 | 4.8 | 0.3 | 0.5 | No | — | 108 | 32 |
| 13 | 1.20 | 4.7 | 0.4 | 0.5 | No | — | 105 | 33 |
| 14 | 1.18 | 4.5 | 0.4 | 0.5 | No | — | 102 | 35 |
| 15 | 2.2 | 1.0 | 0.45 | 0.6 | Yes | 45 | 80 | 6 |

<Evaluation>

For the synthetic single crystal diamonds of samples 1 to 14, the concentration of nitrogen atoms, the X-ray absorption fine structure, the presence/absence and the maximum diameter of the first region, the Knoop hardness, and the fracture strength (cracking load) were measured. Based on the XAFS spectrum obtained from the measurement of the X-ray absorption fine structure, $I_{405}/I_{412}$, the full width at ¾ maximum of the peak at an energy of 405±1 eV, $I_{401}/I_{405}$, and the full width at ¾ maximum of the peak at an energy of 401±1 eV were calculated. Since the measurement methods have been described in detail in the first embodiment, the description thereof will not be repeated.

The results are listed respectively in the column of "concentration of nitrogen atoms", the columns of "$I_{405}/I_{412}$", "¾ W of $I_{405}$", "$I_{401}/I_{405}$" and "¾ W of $I_{401}$" under the "XAFS spectrum", the columns of "Yes or No" and "maximum diameter" under the "first region", the column of "Knoop hardness", and the column of "cracking load" in Table 1. When the first region is not present, it is indicated by "No" in the column of "Yes or No" under the "first region".

<Discussion>

The method of producing the synthetic single crystal diamond of each of samples 1 to 8 and samples 12 to 14 correspond to an example. The synthetic single crystal diamond of each of samples 1 to 8 and samples 12 to 14 corresponds to an example. It was confirmed that the synthetic single crystal diamond for each of samples 1 to 8 and samples 12 to 14 had a Knoop hardness of 102 GPa or more and a cracking load of 22 N or more, and thereby had high hardness and excellent chipping resistance.

The method of producing the synthetic single crystal diamond of sample 9 corresponds to a comparative example in which the first temperature is set to 1700° C., the temperature-maintaining time in step 3b is set to 60 minutes, the temperature-raising time in step 3a is set to 60 minutes, and the temperature-lowering time in step 3c is set to 60 minutes. Since the ratio $I_{405}/I_{412}$ of the synthetic single crystal diamond of sample 9 is 1.6, the synthetic single crystal diamond of sample 9 corresponds to a comparative example. The synthetic single crystal diamond of sample 9 had a low Knoop hardness and a low cracking load, and thereby had a low chipping resistance as compared with the synthetic single crystal diamond of an example.

The method of producing the synthetic single crystal diamond of sample 10 corresponds to a comparative example in which in step 3b is set to 60 minutes, the temperature-maintaining time in step 3a is set to 60 minutes, and the temperature-lowering time in step 3c is set to 60 minutes. Since the ratio $I_{405}/I_{412}$ of the synthetic single crystal diamond of sample 10 is 1.5, the synthetic single crystal diamond of sample 10 corresponds to a comparative example. The synthetic single crystal diamond of sample 10 had a low Knoop hardness and a low cracking load, and thereby had a low chipping resistance as compared with the synthetic single crystal diamond of an example.

The method of producing the synthetic single crystal diamond of sample 11 corresponds to a comparative example in which the second step and the third step are not performed. Since the ratio $I_{405}/I_{412}$ of the synthetic single crystal diamond of sample 11 is 2, the synthetic single crystal diamond of sample 11 corresponds to a comparative example. The synthetic single crystal diamond of sample 11 had a low Knoop hardness and a low cracking load, and thereby had a low chipping resistance as compared with the synthetic single crystal diamond of an example.

The method of producing the synthetic single crystal diamond of sample 15 corresponds to a comparative example in which the second step and the third step are not performed. Since the ratio $I_{405}/I_{412}$ of the synthetic single crystal diamond of sample 15 is 2.2, the synthetic single crystal diamond of sample 15 corresponds to a comparative example. The synthetic single crystal diamond of sample 15 had a low Knoop hardness and a low cracking load, and thereby had a low chipping resistance as compared with the synthetic single crystal diamond of an example.

Although the embodiments and examples of the present disclosure have been described above, it is expected from the beginning that the configurations of the embodiments and examples described above may be combined appropriately or modified in various ways.

It should be understood that the embodiments and examples disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST

1: single crystal diamond; 2: insulator; 3: carbon source; 4: solvent metal; 5: seed crystal; 6: pressure medium; 7: graphite heater; 10: sample chamber

The invention claimed is:

1. A synthetic single crystal diamond containing nitrogen, in an X-ray absorption fine structure spectrum thereof, a ratio $I_{405}/I_{412}$ between an intensity $I_{405}$ of a peak which appears at an energy of 405±1 eV and has a full width at ¾ maximum of 3 eV or more and an intensity $I_{412}$ of a peak which appears at an energy of 412±2 eV being 1.43 or less.

2. The synthetic single crystal diamond according to claim 1, wherein
the ratio $I_{405}/I_{412}$ is 1.33 or less.

3. The synthetic single crystal diamond according to claim 1, wherein
in the X-ray absorption fine structure spectrum thereof, a ratio $I_{401}/I_{405}$ between an intensity $I_{401}$ of a peak which appears at an energy of 401±1 eV and has a full width at ¾ maximum of less than 1.5 eV and the intensity $I_{405}$ is greater than 0.2.

4. The synthetic single crystal diamond according to claim 1, wherein
the concentration of nitrogen atoms in the synthetic single crystal diamond is 1 ppm or more and 3000 ppm or less.

5. The synthetic single crystal diamond according to claim 1, wherein
the synthetic single crystal diamond includes one or more first regions, each of which includes one or both of non-diamond and vacancies, and
the maximum diameter of each of the first regions is 0.1 μm or more and 40 μm or less.

6. The synthetic single crystal diamond according to claim 1, wherein
in a fracture strength test in which a spherical diamond indenter having a tip radius of 50 μm is pressed against a surface of the synthetic single crystal diamond at a loading speed of 100 N/min, the synthetic single crystal diamond has a cracking load greater than 20 N.

7. The synthetic single crystal diamond according to claim 1, wherein the synthetic single crystal diamond has a Knoop hardness of 100 GPa or more in a <100> direction on a {100} plane.

8. A tool including a synthetic single crystal diamond according to claim 1.

9. A method of producing a synthetic single crystal diamond according to claim 1, comprising:

a first step of preparing a diamond single crystal containing nitrogen by a temperature difference process using a metal solvent;

a second step of irradiating the diamond single crystal with one or both of an electron beam and a particle beam so as to apply an energy of 100 MGy or more and 1000 MGy or less to the diamond single crystal; and a third step of heat-treating the diamond single crystal obtained in the second step so as to produce the synthetic single crystal diamond, the third step including:

a step 3a of placing the diamond single crystal obtained in the second step in a vacuum atmosphere or an inert gas atmosphere, and raising the temperature of the atmosphere to a first temperature of 1750° C. or more and 2000° C. or less under a pressure not higher than normal pressure;

a step 3b of maintaining the temperature of the atmosphere raised to the first temperature at a second temperature within a range of the first temperature±10° C. for 1 minute or more and 30 minutes or less; and a step 3c of lowering the temperature of the atmosphere maintained at the second temperature to 1000° C. or less, in the step 3a, the temperature of the atmosphere being raised from 1000° C. to the first temperature in 1 minute or more and 30 minutes or less, and in the step 3c, the temperature of the atmosphere being lowered from the second temperature to 1000° C. in 1 minute or more and 15 minutes or less.

\* \* \* \* \*